United States Patent
Ratnakumar et al.

(10) Patent No.: US 6,556,487 B1
(45) Date of Patent: Apr. 29, 2003

(54) NON-VOLATILE STATIC MEMORY CELL

(75) Inventors: Nirmal Ratnakumar, San Jose, CA (US); Cathal G. Phelan, Mountain View, CA (US); Kenelm G. D. Murray, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/871,172

(22) Filed: May 31, 2001

Related U.S. Application Data
(60) Provisional application No. 60/233,957, filed on Sep. 20, 2000.

(51) Int. Cl.⁷ .................................................. G11C 7/00
(52) U.S. Cl. ................................... 365/189.08; 365/154
(58) Field of Search ............................. 365/189.08, 154, 365/156, 226, 185.01, 185.07, 185.05

(56) References Cited

U.S. PATENT DOCUMENTS

| | | | |
|---|---|---|---|
| 4,132,904 A | 1/1979 | Harari | 307/238 |
| 4,799,194 A * | 1/1989 | Arakawa | 365/154 |
| 4,800,533 A | 1/1989 | Arakawa | 365/228 |
| 5,065,362 A | 11/1991 | Herdt et al. | 365/154 |
| 5,353,248 A | 10/1994 | Gupta | 365/154 |
| 5,440,508 A | 8/1995 | Pathak et al. | 365/154 |
| 5,488,579 A | 1/1996 | Sharma et al. | 365/185 |
| 5,496,756 A | 3/1996 | Sharma et al. | 437/52 |
| 5,602,776 A * | 2/1997 | Herdt et al. | 365/154 |
| 5,892,712 A * | 4/1999 | Hirose et al. | 365/154 |
| 6,285,586 B1 * | 9/2001 | Lung et al. | 365/185.08 |

* cited by examiner

Primary Examiner—Richard Elms
Assistant Examiner—Anh Phung
(74) Attorney, Agent, or Firm—Christopher P. Maiorana, P.C.

(57) ABSTRACT

A non-volatile SRAM cell including (i) a nonvolatile memory element, (ii) a volatile memory element coupled to the nonvolatile memory element and (iii) a gate circuit coupled to the nonvolatile memory element. The gate circuit is configured to transfer data to and from a first input/output line into the volatile memory element.

17 Claims, 8 Drawing Sheets

NON-VOLATILE STATIC MEMORY CELL

This application claims the benefit of U.S. Provisional Application No. 60/233,957, filed Sep. 20, 2000 and is hereby incorporated by reference in its entirety.

FIELD OF THE INVENTION

The present invention relates to SRAM cells generally and, more particularly, to a non-volatile SRAM cell that can be manufactured using a conventional floating-gate (e.g., EPROM, EEPROM or flash) or floating charge storage layer (e.g., SONOS or MNOS) technology. The present non-volatile SRAM cell may also function as a combination ROM-RAM cell (e.g., where the cell provides a ROM function on power-up and a RAM function under normal operating conditions).

BACKGROUND OF THE INVENTION

One example of a conventional non-volatile SRAM cell can be found in U.S. Pat. No. 5,488,579, which is hereby incorporated by reference in its entirety. The cell of the 579 patent includes a three transistor non-volatile stack (i.e., with source-drain terminals in series), but does not shunt the SRAM pass transistor. The pass transistors also receive a second positive supply voltage, Vdd2, that differs from a conventional first positive supply voltage (e.g., Vcc or Vdd1). The stack is made up of PMOS transistors, with a PMOS SONOS device occupying the middle position.

The 579 patent has one or more of the following disadvantages: (i) a two-cycle cell that requires CLEAR and STORE non-volatile operations on power-fail in the worst case scenario, (ii) the cell is less suitable for combination ROM/SRAM due to potential finite disturb problems, and/or (iii) the cell has little margin for error (e.g., one must take significant care on RECALL to weaken the volatile latch for correct transfer of non-volatile data).

SUMMARY OF THE INVENTION

The present invention concerns a non-volatile SRAM cell, comprising (i) a nonvolatile memory element; (ii) a volatile memory element coupled to the nonvolatile memory element; and (iii) a gate circuit coupled to the nonvolatile memory element, wherein the gate circuit is configured to transfer data to and from a first input/output line into the volatile memory element.

Another aspect of the present invention concerns a method for recalling data previously stored in a volatile memory, comprising the sequential steps of: (a) storing the data in a non-volatile memory element coupled to the volatile memory upon a power fail event; (b) applying power to a device containing both the non-volatile memory element and the volatile memory; and (c) recalling said data from said non-volatile memory element into said volatile memory. In one embodiment of this aspect, the method recalling step comprises the steps of: (c-1) writing a predetermined digital logic value into the volatile memory, and (c-2) reading the non-volatile memory element.

The objects, features and advantages of the present invention include a non-volatile static memory cell that comprises a conventional SPAM cell and control circuitry, with (i) only one or two additional non-volatile transistors, (ii) only two extra control lines and a controlled power/voltage supply, and/or (iii) non-volatile memory elements that do not interfere with normal SRAM operation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
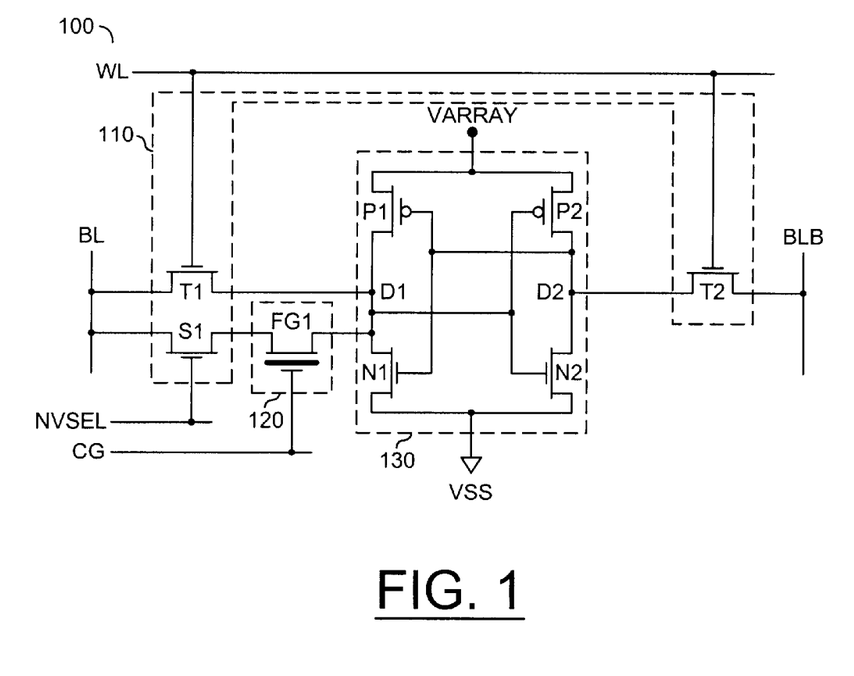
FIG. 1 is a schematic diagram of a first embodiment of the present invention.

FIG. 1 shows a diagram of a non-volatile SRAM (NVSRAM) cell 100 in accordance with a preferred embodiment of the present invention. The cell 100 generally comprises a gate 110, a nonvolatile memory element (NVM) 120 coupled to the gate, and a static random access memory element (SRAM) 130. Gate 110 receives and/or provides one or more data signals and receives one or more control signals enabling (i) data to be read from or written to SRAM 130, as well as (ii) operations affecting NVM 120. NVM 120 receives one or more control signals enabling programming, erasing and/or reading the NVM, and is configured to receive data from SRAM 130. SRAM 130 is configured to receive data from and/or provide data to input/output (I/O) busses (e.g., BL and BLB and/or circuitry coupled thereto) directly through gate 110 (e.g., through T1 and T2) and/or indirectly through NVM 120 (e.g., through FG1 and S1).

In the embodiment shown in FIG. 1, gate 110 may comprise first and second gate transistors T1 and T2 coupled to SRAM element 130 and receiving a first control signal (e.g., WL) at their gates, and a select transistor S1 coupled to nonvolatile memory element 120 and receiving a second control signal (e.g., NVSEL) at its gate. When cell 100 is single-ended (i.e., receiving data from and/or providing data to only a single bus), second gate transistor T2 may be absent.

As shown in FIG. 1, SRAM element 130 may comprise first and second load transistors P1 and P2, and first and second pulldown transistors N1 and N2. The transistors P1, P2, N1 and N2 may form a latch, but in alternative embodiments, load transistors P1 and P2 may be replaced with one or more resistors, or they may be completely absent (e.g., using a four_transistor SRAM cell such as that disclosed in U.S. Pat. No. 5,835,401; "A 16 Mb 400 MHz Loadless CMOS Four_transistor SRAM Macro," ISSCC 2000, p. 264; "A 1.9 um2 Loadless CMOS Four_transistor SRAM Cell in a 0.18 um Logic technology," IEDM 98, p. 643; and/or "A 0.99 um2 Loadless Four transistor Sram cell in a 0.13 um Generation CMOS technology," IEDM 99, the relevant portions of which are incorporated herein by reference).

Figure 2A:
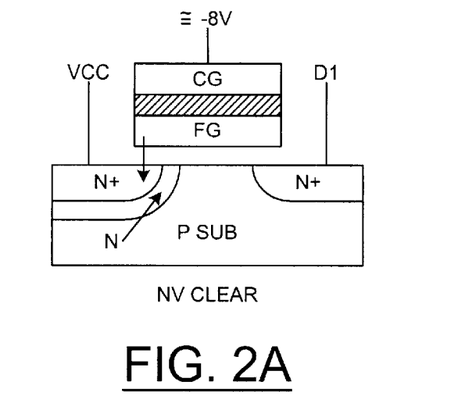
FIGS. 2(A), 2(B) and 2(C) are cross-sections, respectively depicting three operational modes of the non-volatile/floating gate transistor of FIG. 1.
Figure 2B:
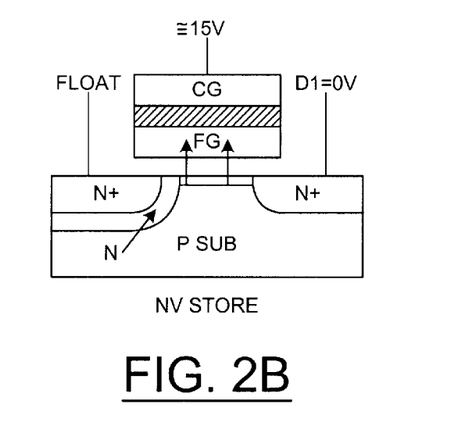
Figure 2C:
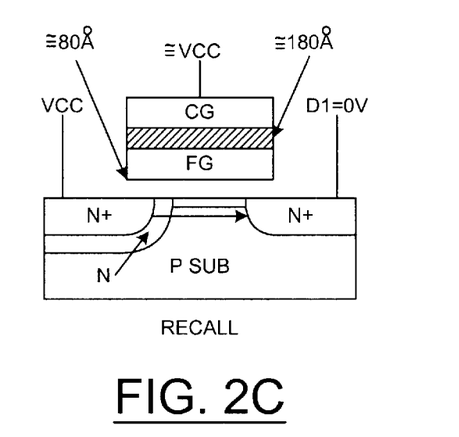

Also as shown in FIG. 1, non-volatile memory element 120 may comprise a floating gate transistor (e.g., FG1), but may also comprise any type of readable and writable (or electrically erasable and programmable) nonvolatile transistor. FIGS. 2(A)–2(C) show a cross-sectional view of FG1, in which the floating gate transistor is fabricated on a P-doped substrate. Conventional $N^+$ implants may form the source/drain terminals, and a conventional deep or directional N implant may form a "tip" implant at the source/drain terminal coupled to select transistor S1. This "tip" implant may be advantageous for electrically programming and/or erasing a FG transistor. The NV transistor (FG1) may further comprise (i) a floating gate (e.g., FG in FIGS. 2(A)–2(C)), separated from the substrate by a gate oxide layer having a thickness of 20–150 Å, preferably 50–100 Å, and in one embodiment about 80 Å, and (ii) a control gate (e.g., CG in FIGS. 2(A)–2(C)), separated from the floating gate by an interpoly oxide layer having a thickness of 40–300 Å, preferably 100–250 Å, and in one embodiment about 180 Å.

From an alternative perspective, gate 110 may comprise one or more pass gate transistors (e.g., T1 and T2), and NVM 120 may comprise select transistor S1 in series with transistor FG1, as an additional, parallel path to the gate, between an I/O line (e.g., BL) and the SRAM 130 (and more specifically, node D1 of the latch). The cell 100 may thus be implemented as a compact SRAM cell with non-volatile (NV) shadow memory. This combination RAM-NVM cell may be manufactured using conventional floating-gate of floating charge storage layer processing technologies. The non-volatility of this cell, by which the data stored in SRAM cell 130 is saved in NVM 120 when it might otherwise be lost, may be achieved with only the transistor FG1, with a minimal use of extra control lines. The cell 100 may thus be ideal for use in a data-save on power-down type application. A number of cells 100 may be combined to form an array.

From the alternative perspective, cell 100 may thus comprise a conventional 6-transistor SRAM cell with the transistor FG1 added for NVM storage and for recall. The select transistor S1 generally isolates the transistor FG1 from the effects of the I/O line(s) (e.g., BL) and SRAM cell 130 during normal operation of the SRAM.

A plurality of the present non-volatile SRAM cells, or a plurality of blocks of the non-volatile SRAM cells, may form an array. The array, or any blocks thereof, may independently comprise a matrix of n by m cells, wherein n and m respectively designate the number of rows and columns of the array or block, and n and m are each independently an integer of at least 2, preferably at least 4, and more preferably at least 8. Although there is no upper limit to the size of the array, as a practical matter, the array or block thereof may have a maximum of about 20 megabits (20 Megs), preferably about 10 Megs, more preferably about 4 Megs.

Table 1 below shows the node voltages/data states for various modes of operation: NV-CLEAR, NV-STORE, NV-RECALL and normal volatile SRAM operation, where X denotes a Don't Care" state. Data and its complement ("datab") are either VCC or 0 and are generally at opposite states.

TABLE 1

| Operation | CG | NVSEL | WL | BL | BLB | D1 | D2 | PG Vt | COMMENT(S) |
|---|---|---|---|---|---|---|---|---|---|
| NV-CLEAR | VKN (−7V to −12V) | >VCC (to pass VCC) | 0V | VCC | X | X | X | low | Volatile data not affected. CG and NVSEL voltages may be pulsed. NVM may have $I_{BET}$. |
| NV-STORE | VPP (12–20V; −15V) | 0V | 0V | X | X | data | datab | low (D1 = VCC) or high (D2 = VCC) | If D1 = 0V, then FN tunneling; if D1 = VCC, no tunneling. CG voltage may be pulsed. |
| NV-RECALL, cells pre-set to all 1's | 0V | 0V | VCC | 0V | VCC | 0V | VCC | (may be low or high) | Drop VARRAY below VCC just after writing 1's to minimize current throughput |
| NV-READ (NV-RECALL, all 1's) | Positive bias 1 | VCC | 0V | 0V | X | datab | data | low (D1 = VCC) or high (D2 = VCC) | Positive bias 1 is the natural (unprogrammed) threshold of FG1. Recalled data inverted. Raise VARRAY to VCC after READ. |
| NV-RECALL, cells pre-set to all 0's | 0V | 0V | VCC | 0V | VCC | 0V | VCC | (may be low or high) | Drop VARRAY below VCC just after writing 0's. Alternatively, VARRAY may = VCC. |
| NV-READ (NV-RECALL, all 0's) | Positive bias > bias 1 | >VCC | 0V | VCC | X | data | datab | low (D1 = 0V) or high (D2 = 0V) | Recalled data true (not inverted). Raise VARRAY to VCC after READ (if necessary). |
| SRAM WRITE/READ | From 0V to VCC | 0V | VCC | VCC or 0V | 0V or VCC | VCC or 0V | 0V or VCC | low | Normal SRAM operation. |

TABLE 1 shows NV-CLEAR and NV-STORE operations, as well as two different NV-RECALL and NV-READ operations (one which writes all "0"s, providing "true" [non-inverted] data, but which includes, adjusting the supply voltage to the array; and one which writes all "1"s, providing inverted data, but which needs no array supply voltage adjustment). In general, NV-STORE is preceeded by NV-CLEAR to ensure adequate margins (and thus success) for NV-STORE. In one aspect of the present invention, the combination of NV-CLEAR and NV-STORE operations may be considered "programming" the NVM with the SRAM data. NV-RECALL does not have to be followed immediately by NV-CLEAR, but under certain conditions, or in certain embodiments, it may be advantageous to do so.

The following is a detailed operational description of the cell 100 of FIG. 1. Exemplary NV operations of NVM transistor FG1 in FIG. 1 are shown on the cross-sections in FIG. 2. As described above, the cell 100 may comprise a six-transistor (6T) SRAM cell, which is fully symmetrical for conventional SRAM operations (e.g., READ and/or WRITE). In addition, the floating gate transistor FG1 is typically used only for NV-STORE and NV-RECALL operations. "Soft" NV-STORE (e.g., independent of power decreases or failures) and "soft" NV-RECALL operations are feasible, and may be controlled by conventional logic circuitry adapted to store and recall NV data in accordance with the description(s) herein.

When the power supply to a device containing the present NVSRAM drops below a predetermined value (e.g., from 50% to 95%, preferably from 75% to 90%, of the nominal value), conventional power or voltage detection circuitry (e.g., comprising a conventional voltage comparator) may detect a power loss or power failure (or that such an event may be imminent). In any case, such power loss, power failure, detection thereof or detection that such event may be imminent may be considered to be a "power fail event". A control signal may be generated by such detection circuitry (which may further comprise conventional logic circuitry configured to generate such a signal), which in turn, will generate appropriate signals with appropriate digital or analog values to perform the NVM functions described herein.

As described above, typically, the first NVM function that occurs on detecting a "power-fail" event or condition is clearing any data stored in the NVM (e.g., "NV-CLEAR"). This helps ensure that volatile data can be read from the SRAM element 130 and written into NVM element 120 using a minimal amount of power.

During a NV-CLEAR operation, the floating gate of FG1 is at a negative potential (e.g., about one-half of the voltage on the control gate) and the n+ diffusion on the bit line side (e.g., coupled to S1) is at Vcc. The threshold voltage Vt of FG1 is then pulled low by discharge of electrons from the floating gate (FG) to the n+ diffusion common to it and select transistor S1.

There may be a band to band tunneling current ($I_{BBT}$) flowing from the bit line which is biased at Vcc to the P substrate at zero bias. Since NV-CLEAR is typically done when Vcc is at or near its nominal value, supplying $I_{BBT}$ is generally not a problem. The control gate CG is at negative potential (e.g., VNN, which may be from about −5V to about −15V, preferably from about −7V to about −12V, and in one embodiment is about −8V), and the transistor FG1 is non-conducting. Therefore, the SRAM latched state is not disturbed by NV-CLEAR.

More specifically, as shown in FIG. 2(A), an NV-CLEAR operation may comprise applying a negative potential (VNN; e.g., any of the negative potentials described herein or a range such as −7 to −11V) to the control gate CG. In such a state, the bit line voltage VBL (and, optionally and independently, the complementary bit line voltage VBLB) may move to VCC. The wordline voltage VWL may move (or preferably be pulsed, optionally using a conventional charge pump circuit; see, e.g., CY refs: CD98018 and CD98019) to a positive potential>VCC to pass the supply voltage VCC to the source/drain terminal of FG1 coupled to select transistor S1 (i.e., opposite that source/drain terminal coupled to node D1 of the SRAM latch).

The NV-CLEAR operation may apply such voltages to such nodes for a time ranging from 1 to 100 ms, preferably 1–10 ms, although it may be>100 ms or<1 ms, as long as the conditions result in a low threshold voltage Vt for FG1.

After data is cleared from NVM 120, the data held at that time in SRAM 130 may be written into NVM 120 (a programming operation, or as used herein, "NV-STORE"). NV-STORE operations may be initiated in at least two modes: (i) when a power loss or failure (or a condition indicating that such power loss or failure is imminent) is sensed, or (ii) when the current array data is to be stored, independent of power loss: or failure (e.g., a "soft" store). The latter mode may be particularly advantageous, in one example, when including the present NVSRAM array in a PLD (programmable logic device; e.g., a simple PLD [SPLD], complex PLD [CPLD], field programmable gate array [FPGA], etc.), a programmable clock generator, a microcontroller (e.g., a programmable general purpose microcontroller, a Universal Serial Bus microcontroller, etc.), a microprocessor or digital signal processor, etc. In such devices, new programming or configuration information may be loaded or downloaded into the volatile memory for immediate use and fastest (down)loading speed, then stored in the nonvolatile memory at a more convenient time.

Specifically with regard to the circuit shown in FIG. 1, during a NV-STORE operation, the transistor S1 is off and the bit line BL is isolated from the transistor FG1. The control gate CG of transistor FG1 may be at a high positive potential Vpp. If D1 is at 0V, the FG1 channel is at 0V, and electrons are injected by Fowler-Nordheim (FN) tunneling (preferably uniform FN tunneling) from the channel into the floating gate (FG); and the Vt of transistor FG1 goes high. If D1 is at YCC, the potential difference between the channel which is at VCC and the FG is not high enough for any substantial electron injection, and Vt of FG1 remains low.

Since the control gate voltage (VCG) is generally at a negative potential VNN, both of the transistors FG1 and FG2 may be non-conducting and the SRAM latched state is not disturbed. At the end of programming, the wordline voltage VWL is generally first brought to zero before the negative supply voltage VNN is removed.

A write operation may occur when the control gate voltage VCG=VCC and the transistors FG1 and FG2 are conducting. The regular SRAM Write/Read operations are generally performed through the wordline voltage VWL, the bit line voltage VBL and the bit line voltage VBLB as indicated in TABLE 1.

The time required for the NV-STORE operation is typically 1–20 msec, depending on the number of bits in the array, the supply voltage, the available maximum current, etc. Because NV-STORE may involve uniform FN tunneling, there may be no band-to-band (BTB) current, and in such a case, the power consumed is only the power used to charge up the floating gates (a negligible amount). Therefore, the NV-STORE operation in the present invention is ideal for the case of storing data in nonvolatile memory during power loss or failure.

For transistor FG1, since transistor S1 is off, an inversion channel, created when the control gate voltage (VCG) is at VPP, is at the voltage present on node D1 (VD1). When the SRAM cell stores a "1", VD1=VCC, and the voltage difference between the channel and the floating gate may not be large enough to cause FN tunneling of electrons through the tunnel region. Therefore, when the SRAM stores a "1", the threshold voltage Vt of the transistor FG1 generally remains low.

However, when the volatile memory element stores a "0" state (VD1=0V and VD2=VCC), at the end of NV-STORE, the threshold voltage Vt of the transistor FG1 is high. The SRAM cells are not generally disturbed during a NV-STORE operation because the pass transistors T1 and T2 are off (since the wordline voltage [VWL]=0V).

At this point, the data in the volatile memory has been safely stored in NVM. Should power to the device containing the present NVSRAM fail completely, the data that was in volatile memory at the time of the power failure may be simply recalled from NVM when power is reapplied to the device. To recall data stored in the NVM 120, one may perform an NV-RECALL operation, which may comprise a PRESET operation followed by a NV-READ operation, and which may be performed, for example, according to either of the two following methods:

Recall Method 1

Set the array voltage VARRAY=$V_{A1}$>VCC, and write 0's into the SRAM array to pre-set the SRAM cells to all 0's. The voltage $V_{A1}$ is generally chosen to be sufficiently low that cells in which transistor FG1 has a low threshold voltage ($Vt_{low}$) will overwrite a "1" that may be stored in the cell.

Thereafter, appropriate voltages are applied to the select and NVM transistors to enable reading the NVM data from NVM 120 into the SRAM cell 130 (see, e.g., Table 1 above). Exemplary voltages applied to various nodes in and around FG1 for in the NV-READ step of this recall method are shown in FIG. 2(C). The voltage applied to CG (VCC) is exemplary. One may apply any positive bias greater than the natural (unprogrammed) threshold of the NVM transistor to CG, but preferably, a voltage of from VCC/2 to VCC is applied, and in the embodiment of FIG. 2(C), VCC is applied. The voltage at D1 (0V) results from writing a "0" into the SRAM cell in the preceding step.

Recall Method 2

1. Write 1's by setting the bit line voltage VBL=VCC, the bit line voltage VBLB=0 and the wordline voltage VWL= VCC.
2. Write 0's into cells whose floating gate threshold voltage Vt=$V_{low}$ by passing the bit line voltage VBL=0 through the transistors S1 and FG1.
3. Since the recalled state in this latter method will be the inverse of the stored state, restore the original polarity of the data by either:
   a. repeating the NV-STORE and NV-RECALL operations (or performing a "dummy store and recall"; see the description of the embodiment of FIG. 4 infra); or
   b. inverting the output from the I/O buffer and/or the sense amplifier corresponding to the cell by, for example, passing that output through an inverter or inputting that output along with a reference signal corresponding to the FG1 threshold state into an exclusive OR circuit as shown in FIGS. 9(A)–9(D) ($vt_{low}$ corresponds to REF= 1, and $V_{thigh}$ corresponds to REF=0), then passing the inverted data through a gate responding to, e.g., a NV-REINVERT control signal (generated using conventional logic from the [control] signals generating the NV-RECALL and/or NV-READ states described above and in Table 1) back onto the bit lines for storing in the SRAM 130.

In this recall method, the reference signal may be stored in a reference NVSRAM cell, whose output=0 for cells whose NVM has a high threshold voltage. When the recalled state is inverted, the reference NVSRAM cell output may also be inverted. An XOR circuit may now invert the recalled inverted state, leading to correct polarity.

The preferred recall for non-inverted data is "cells preset to all 0's" in Table 1 above. Data inversion on RECALL (as disclosed in the 579 patent) is not necessarily an ideal mode of operation, since data tracking and re-inversion circuitry is required. Nonetheless, under certain conditions (e.g., where it is not convenient or possible to reliably adjust or lower the voltage to the array or write all 0's into the SRAM array), data inversion is perfectly appropriate and may even be preferred.

When using the "write all 1's" NV-RECALL method, the supply voltage to the NVSRAM cell array (e.g., VARRAY) may be decreased to weaken the latch so that the non-volatile data can be written into the SRAM, even at a typical end-of-life NVM charge retention state (e.g., 10 years or more). With VARRAY held at this low value, the bit line BL and the control gate CG are kept to VCC (not decreased) and, ideally, the signal NVSEL is taken sufficiently above VCC to enable passing VCC from BL to FG1, but not so much above VCC to risk breakdown of the select transistor gate oxide.

In a preferred embodiment, VARRAY is decreased to a worst case maximum value of the PMOS and/or NMOS thresholds in the SRAM element, so that volatile data may be written from the non-volatile transistor and/or held (however weakly, either without overwriting or once written from NVM). A threshold mismatch may advantageously allow data to be maintained by the MOS devices (which may be a slight weak-inversion) even if VARRAY decreases below the worst case maximum value of the SRAM transistor thresholds.

The FG1/S1 chain may pull the D1 node high if cell 100 recalls a cleared state (FG Vt=low). Therefore, the VARRAY decrease is generally selected to differentiate successfully between a cleared floating gate FG1 (Vt=low, NVM data=0), on the one hand, and a programmed floating gate FG1 (Vt=high, NVM data=0), on the other hand. The control gate CG may also be taken to a non-VCC value, depending on the end-of-life characteristic requirements of the non-volatile floating gate FG1.

An alternative embodiment of the NVSRAM cell 100 may replace the select transistor S1 with a PMOS transistor. The voltage on node NVSEL may be changed as follows while all other signals are same as in TABLE 1.

All the other biases are the same as in Table 1. The advantage of this alternative cell is that the gate of PMOS transistor S1 does not need a bias>Vcc.

When the cell 100 saves data in the NVM on power loss or failure (e.g., during a "power fail" condition), an external supply voltage support (e.g., a battery) may be advantageous for both NV-CLEAR and NV-RECALL cycles. If a CLEAR cycle is executed just after a RECALL cycle, a power decrease or failure may interrupt the CLEAR process, and data in NVM could be lost. Under these circumstances, a CLEAR cycle would generally have to be complete before a NV-STORE operation takes place to re-capture the data, and an external battery may supply sufficient power to enable

TABLE 2

| Operation | Voltage at NVSEL (S1 = PMOS) | Comment(s) |
|---|---|---|
| NV-CLEAR | 0 | To pass VBL ≧ VCC to $N^+$ of FG1 to lower FG Vt. |
| SRAM WRITE/READ | VCC | To isolate the FG transistor. |
| NV-STORE | VCC | To isolate FG1 from VBL. |

TABLE 2-continued

| Operation | Voltage at NVSEL (S1 = PMOS) | Comment(s) |
|---|---|---|
| NV-RECALL METHOD 1 (WRITE 0's) | VCC | Turn off S1; T1 and T2 conducting. |
| NV READ (NV-RECALL METHOD 1) | 0 | Couple VBL ≧ VCC to FG1 |
| NV-RECALL METHOD 2 (WRITE 1's) | VCC | Turn off S1; Write thru T1 and T2 |
| NV READ (NV-RECALL METHOD 2) | 0 | Couple VBL = 0 to FG1 (connect). | successful NV-CLEAR, NV-STORE and NV-RECALL operations. The cell 100 does normally consumes little or no additional power during the NV-CLEAR and/or NV-STORE cycles.

In one example, the cleared state will not be disturbed by the volatile data, and may be supported when the volatile data is in a particular state (e.g., a D1 "logic high" state). The programmed state may suffer some risks due to potential SRAM data disturbance, depending on the technology and the VCC supply voltage level. However, the programmed state (e.g., after NV-STORE, FG1=$Vt_{high}$) of the cell 100 will largely exist and be maintained, even in power-down mode. Threshold voltage disturbances may be controlled by applying a predetermined bias voltage on the control gate CG (which is preferably one that, in the example of FIG. 1, maintains FG1 in a non-conducting state) and by selecting a minimal voltage supply to the array.

The NVM may be programmed (i) the first time the cell 100 is powered up and (ii) after each NV-RECALL cycle. One design objective may be to simultaneously lower the threshold voltage Vt of the nonvolatile transistor FG1 when the control gate voltage VCG=VCC and the transistor FG1 is in a conducting state.

Switching of the state of latch draws a current through VARRAY. To minimize this current, recall operations may be done on selected groups of word lines sequentially, instead of on the whole array simultaneously.

During normal SRAM write/read operations, Vt disturbances of the NV transistor FG1 by the potential at node D1 can be minimized by a careful choice of bias (e.g., between 0 to Vcc) on the control gate CG so that the FG1 Vt can meet the end of life characteristic requirements for either $Vt_{low}$ (an NV-CLEARed state) or $Vt_{high}$ (NV-STOREd state). For "back up on power fail" applications, the NV-CLEARed state should be supported for NVM "end-of-life" conditions.

Figure 3A:
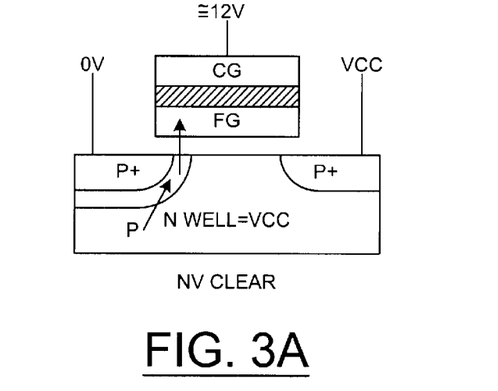
FIGS. 3(A), 3(B) and 3(C) are cross-sections depicting the three operational modes of an alternative non-volatile/floating gate transistor to that of FIGS. 2(A), 2(B) and 2(C)
Figure 3B:
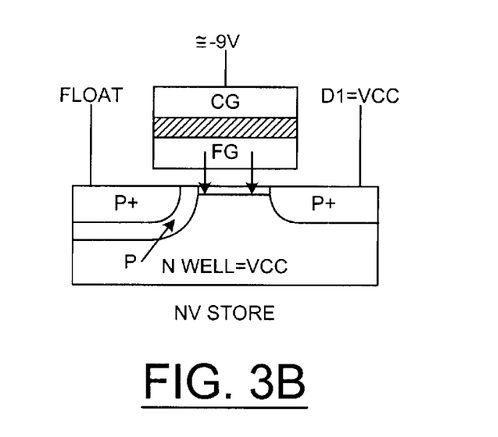
Figure 3C:
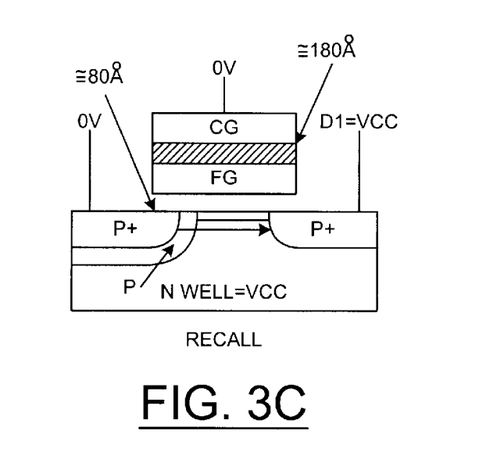

The NV transistor shown in FIG. 2 is shown as an n-channel floating gate transistor that uses FN tunneling for NV-CLEAR and NV-STORE operations to put its Vt in low and high values, respectively. However, the NV transistor can also be a p-channel floating gate transistor, fabricated in an N-well, as depicted in FIG. 3.

During NV-CLEAR, for example, electrons may be injected into the floating gate by band to band tunneling (BBT). The injection of the electrons into the floating gate may make the Vt of the floating gate p-channel transistor positive (i.e., conducting when the bias on CG=0). During NV-STORE, if node D1 is at VCC, then electrons would be discharged to the N-well by FN tunneling, making the Vt of the p-channel floating gate transistor negative or non-conducting. A high threshold voltage Vt may be achieved by hot electron injection into the floating gate due to BBT. Discharge of electrons may be achieved by FN tunneling.

Figure 4:
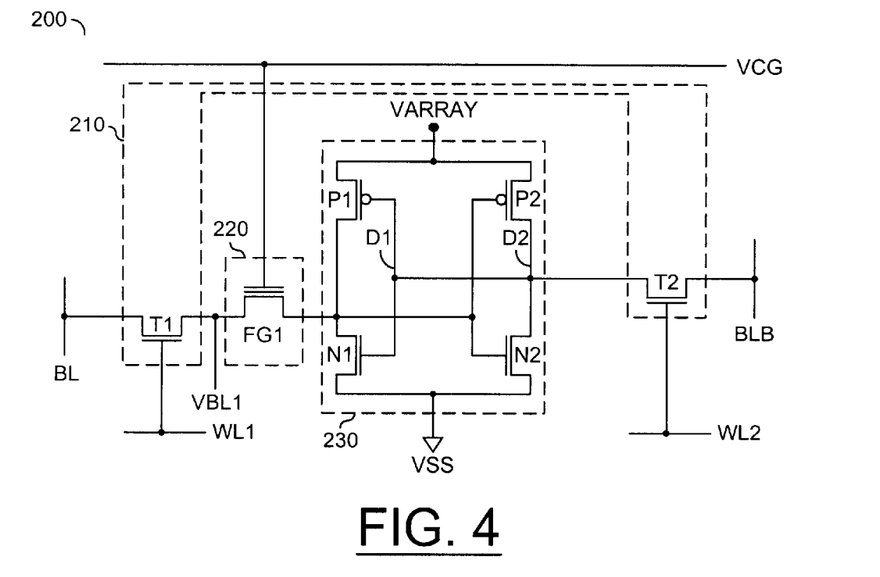
FIG. 4 is a schematic diagram of a second embodiment of the present invention.

Referring now to FIG. 4, an alternate seven-transistor ("7T") NVSRAM cell 200 is shown. The 8T NVSRAM 100 of FIG. 1 may be functionally replaced by 7T NVSRAM cell 200. The 7T NVSRAM cell 200 comprises a gate 210, a nonvolatile memory element (NVM) 220 coupled to the gate, and a static random access memory element (SRAM) 230, just as for the 8T PNVSRAM 100 of FIG. 1. The primary difference between 7T NVSRAM cell 200 and 8T NVSRAM cell 100 is that gate 210 has one less transistor than gate 110 (or, alternatively, that NVM 220 is not directly coupled to I/O line BL and has one less transistor than NVM 120).

In FIG. 4, the bit line BL may be connected to D1 through a series combination of pass transistor T11 and floating gate transistor FG11, configured such that this series combination is approximately equivalent to the transistor T1 of cell 100 during conventional SRAM READ/WRITE operations, but is equivalent to the series combination of select transistor S2 and floating gate transistor FG1 of cell 100 during NVM operations.

While the 8T NVSRAM cell 100 of FIG. 1 may be coupled to a single word line, the 7T NVSRAM cell 200 of FIG. 4 may be coupled to divided first and second SRAM word lines (e.g., WL1 and WL2). The operation of cell 200 can be explained with reference to the TABLE 3 below (where X=don't care).

TABLE 3

| Mode | Vcg | WL1 | WL2 | BL | BLB | D1 | D2 | Vt of FG11 | Comment(s) |
|---|---|---|---|---|---|---|---|---|---|
| NV-CLEAR | −7 ≦ VNN ≦ −12V, 0.1– 100 ms) | >VCC | 0V | ≧VCC | 0V | data | datab | Low | WL voltage may be pulsed. Program FG Vt's to low state (<<VCC or <0V). |
| SRAM WRITE | ≧VCC | VCC | VCC | −VCC/2 to VCC−Vt | −VCC/2 to VCC−Vt | data | datab | Low | FG11 strongly conducting; NVSRAM cell operates as conventional SRAM cell. |
| SRAM READ | ≧VCC | VCC | VCC | −VCC/2 to VCC−Vt | −VCC/2 to VCC−Vt | data | datab | Low | |
| NV-STORE ("1") | Vpp (12– 18V, 0.1– 100 ms) | 0V | 0V | X | X | VCC | 0V | Low | Preceded by NV-CLEAR. |
| NV-STORE ("0") | Vpp (12– 18V, 0.1– 100 s) | 0V | 0V | X | X | 0V | VCC | High | Preceded by NV-CLEAR. |
| NV-RECALL, step 1 | 0V | 0V | VCC | 0V | VCC | 0V | VCC | Low or High | 0's written into all SRAM cells, ≦10 ns. |

TABLE 3-continued

| Mode | Vcg | WL1 | WL2 | BL | BLB | D1 | D2 | Vt of FG11 | Comment(s) |
|---|---|---|---|---|---|---|---|---|---|
| NV-RECALL, step 2 | VCC | VCC | 0V | VCC | 0V | data | datab | Low or High | SRAM array restored to state at time of NV-STORE |

Similar to cell 100, cell 200 stores data from SRAM cell 230 into NVM 220 on a "power fail" condition and recalls the data from NVN 220 back into SRAM 230 when power is reapplied (a so-called "power-up" condition). In the cell 200, floating gate transistor FG11 is generally in series with the pass transistor T11. NV-CLEAR, which may be done upon power loss and which generally is performed after each recall (and generally prior to normal SRAN operations), brings the Vt of FG11 low and enables fast, efficient SRAM READ and WRITE operations in all cells. The description of the other operations of the cell 200 may be similar to those of the cell 100, including decreasing VARRAY during recall. However, for the circuit 200, the bias on the control gate CG during SRAM READ and WRITE operations is at least about VCC, and preferably is about VCC (to minimize power consumption).

Performing NV-CLEAR after NV-RECALL also ensures that the array data can be stored in the NVM elements at the next "power-fail" event. During NV-CLEAR (a global clear or erase operation on all NVM elements in the array), the threshold voltage Vt of the floating gate transistor FG11 may be lowered to a low value (e.g., less than or equal to about 0V). During NV-CLEAR, electrons may be removed from the floating gate of FG11, which may be at a negative potential compared to the node VBL1, which will generally be about or above VCC. By applying a negative VNN pulse to the FG11 control gate, raising or pulsing the voltages on BL (VBL) and WL1 (VWL1) to slightly greater than VCC (typically about from about [VCC+$Vt_{CMOS}$] to about [VCC× 2], where $Vt_{CMOS}$ is the threshold voltage of a PMOS or NMOS transistor, preferably [VCC+(N×$Vt_{CMOS}$)], where N is a number of from 1 to 4, more preferably from 1.2 to 2.5), T11 can pass a voltage of from VCC to VBL to FG11, thereby providing a source of band-to-band tunneling current for FN programming of FG11. During NV-CLEAR, the voltage on WL2 is held to about 0V, and the transistor T12 is thus off (or non-conducting).

Figure 5A:
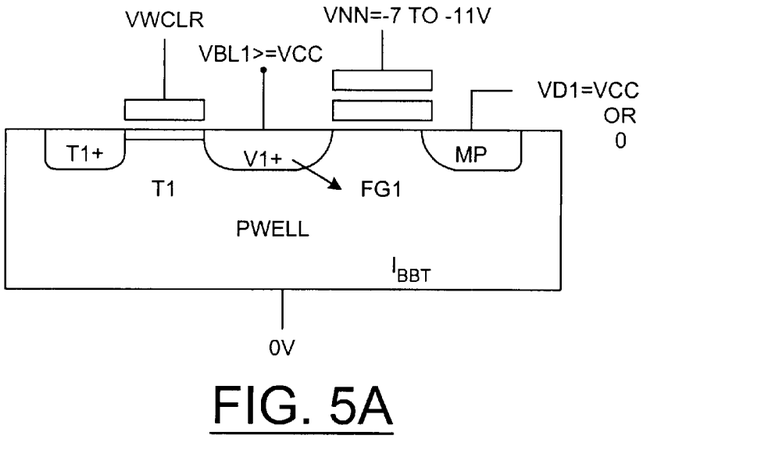
FIG. 5(A) is a cross-sectional view depicting part of the circuit of FIG. 4.
Figure 5B:
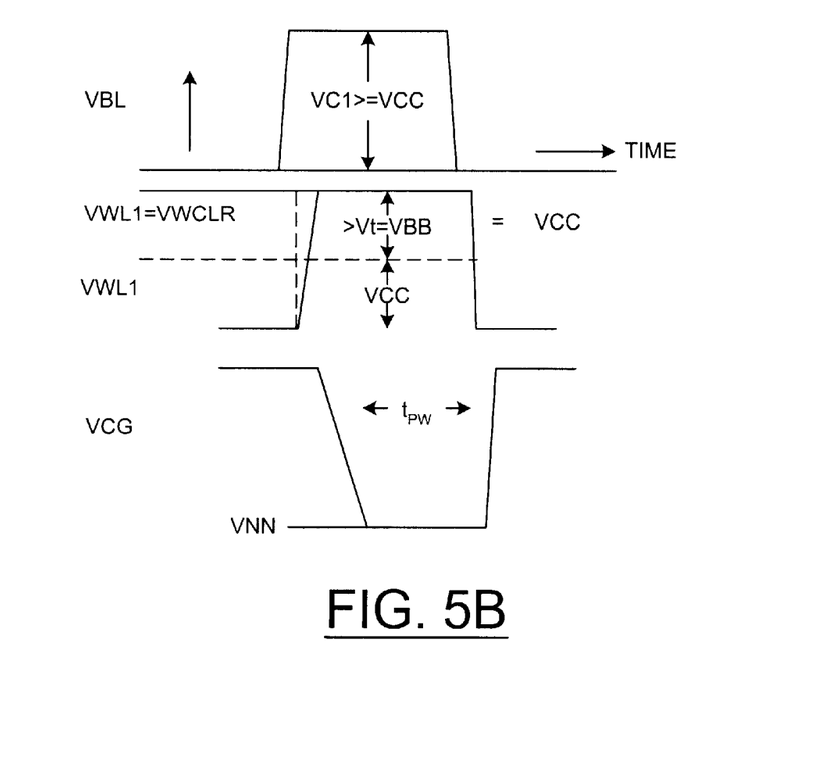
FIG. 5(B) shows a timing diagram relating to one or more operational aspects of the embodiment of FIG. 4.

A cross-sectional view depicting the removal of electrons from FG11 is shown in FIG. 5(A), and timing diagrams relating to the NV-CLEAR operation for cell 200 are shown in FIG. 5(B). At the end of NV-CLEAR, the threshold voltage Vt of FG1 is preferably at a low state, so that FG11 will be in a strong conduction state when the control gate voltage is at VCC (for subsequent SRAM READ/WRITE operations). Furthermore, when the FG11 Vt is low, the drain to source voltage (VDS) of FG11 will also be low.

The transistor T11 is generally turned on by applying a clearing voltage (VWCLR) to the word line WL1. The clearing voltage on word line WL1 is sufficiently greater than VCC to pass the voltage from input/output (I/O) line BL, which is generally about or slightly above VCC, to the n+ diffusion of the floating gate transistor (see, e.g., VBL1 in FIG. 5(A)). In a preferred embodiment, the voltages in excess of VCC (e.g., on word line WL1 and/or bit line BL) may be provided by a conventional charge pump. A bit line voltage higher than VCC may enable a faster clear, or alternatively, a less negative voltage VNN on the control gate.

A combination of positive voltage on the n+ diffusion and a negative voltage on the floating gate may increase the n+ to leakage current due to band to band tunneling ("$I_{BBT}$" in FIG. 5(A)), which can occur when VCC is at its nominal value. The sum of all $I_{BBT}$'s for the array may be reduced by (i) implementing a slow ramp (rate of change) of Vnn and/or the voltages on BL or WL1, and/or (ii) partitioning the array (or portion thereof to be cleared) into sub-blocks by applying VWCLR to selected groups of the word lines WL1.

An exemplary timing sequence of the various voltages and/or pulses applied to the cell 200 in order to clear NVM 220 is shown in FIG. 5(B). The three waveforms, from top to bottom, respectively represent the voltages (Y-axis) on BL, WL1 and the control gate of FG11 (Vcg; also see FIG.4) as a function of time (X-axis). The voltages on BL and WL1 are raised at substantially the same time, and thus, a single control signal may initiate these sub-operations. However, the negative pulse generally applied to Vcg (assuming FG11 is an n-channel transistor; a positive overvoltage is applied when FG11 is a p-channel device, see FIG. 3(A)), which may be initiated before, at substantially the same time as, or even later than the BL and WL1 pulses, takes longer to reach its effective value. Consequently, the timing of the three signals/pulses must be arranged such that their pulse widths ($t_{pw}$) overlap at their effective voltages for a length of time effective to clear the NVM or substantially remove the electrons from the floating gate or charge storage layer of the NV transistor. Generally, this length of time is on the order of 1 ms (e.g., from 100 ns to 10 ms, preferably from about 500 ns to about 5 ms).

After NV-CLEAR, standard SRAM READ/WRITE operations may be performed by setting the voltage on the FG11 control gate (VCG) to about, equal to or greater than VCC. Since FG11 will generally be conducting strongly in this operational mode, the drain to source voltage drop (Vds) across the floating gate transistor channel will generally be quite small, and the effect of FG11 on SPAM cell operations should be minimal. The width-to-length ratio W/L of pass transistor T11 may be larger than the width-to-length ratio W/L of pass transistor T12 to minimize the FG11 Vds effect on the operation of the cell 100. When the n+ source/drain diffusions of FG11 are at or about VCC, the (drain) disturb is generally minimal since VCG should also be at or about VCC.

On detection of a power loss or failure during normal SRAM READ and WRITE operations, an NV-STORE operation may save the volatile data in SRAM 230 (which would otherwise be lost) in NVM 220. NV-STORE may comprise turning off the gate transistor to the true data I/O line (e.g., T11), for example by setting the corresponding word line (e.g., WL1) voltage to 0V. When FG11 is an n-channel device, VCG may be raised or pulsed to a positive overvoltage Vpp (e.g., from about 12V to about 18V, and in one embodiment, about 15V) for a time of from approximately 0.1 to 100 ms, preferably from about 1 to about 10 ms. When FG11 is an n-channel device, VCG may be lowered to a negative "overvoltage" (e.g., Vnn), as shown in FIG. 3(B).

For those SRAM cells storing a logic "0" state (i.e., the voltage at node D1 is approximately 0V), the inversion channel under the FG11 floating gate is generally at zero potential, and the coupling of VCG (at Vpp) to the floating gate is sufficient to charge the floating gate with electrons by FN tunneling from the inversion layer. At the end of a NV-STORE, floating gate transistors connected to SRAM cells with D1 at 0V generally have a high threshold voltage ($Vt_{high}$), where $Vt_{high} \approx VCG_{RAM}$ (where $VCG_{RAM}$ is the control voltage VCG during SRAM READ/WRITE operations).

For those SRAM cells 230 storing a logic "1" state (i.e., the voltage at node D1 is approximately VCC), the inversion channel under the floating gate will generally be at the supply voltage VCC. In such a condition, the voltage difference between the floating gate and the channel is generally insufficient for substantial FN tunneling, and the Vt of the floating gate transistors connected to the SRAM cells storing a 1 generally remain low (i.e., $Vt_{low}$, which in one embodiment is about 0V).

In general, the entire channel of the floating gate transistors may be at a uniform potential for either SRAM data state, and there is generally no BBT current involved in the NV-STORE operation. Therefore, in the present invention, NV-STORE is an extremely low power operation, which may be important when an impending power failure is sensed. For increase the likelihood of success, NV-STORE generally consumes a minimum amount of power.

The array voltage ($V_{ARRAY}$) may also be pumped to maintain $V_{ARRAY}$ at greater than or equal to the nominal value of VCC ($VCC_{NOM}$), to compensate for the decrease in VCC during the NV-STORE operation. Such pumping may be desirable to inhibit FN tunneling of the NVM cells in a 1 state.

Figure 6A:
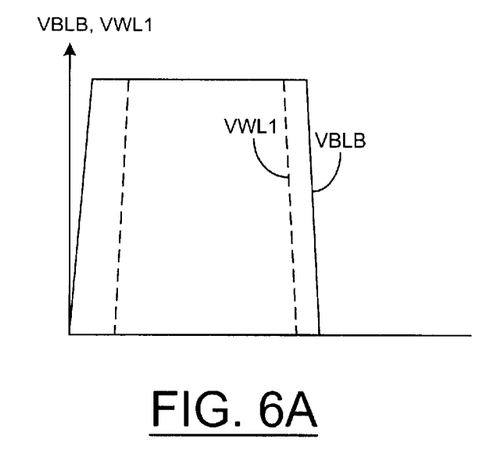
FIGS. 6(A) and 6(B) are timing diagrams showing other operational aspects of the embodiment of FIG. 4.
Figure 6B:
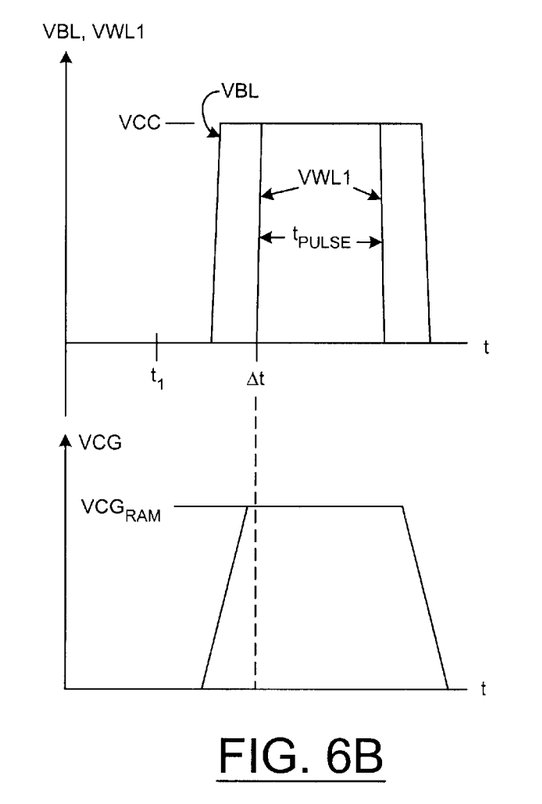

Once the SRAM data is safely stored in the corresponding NVM cells (or transistors), power may fail or be lost without loss of the data. When power is reapplied to the circuit, a NV-RECALL operation may be conducted to restore the data stored in NVM back into the corresponding SRAM cells. NV-RECALL may be conducted by the following sequence, illustrated by the waveforms in FIGS. 6(A)–(B):

1. Assuming the power applied to the circuit is initially 0V, raise $V_{ARRAY}$ to a voltage<VCC, but large enough for data retention in SRAM 230. A lower $V_{ARRAY}$ will reduce the currents generated in those SRAM cells in which the data state changes, relative to a $V_{ARRAY}$=VCC. A $V_{ARRAY}$ value<VCC may be maintained (if necessary or desired) by conventional voltage translation or reduction circuitry (e.g., a diode stack, a conventional buffer receiving the reduced voltage at a source/drain terminal thereof, etc.).

2. Write a single logic state (either all 1's or all 0's) to either the whole array or to blocks thereof (e.g., portions of the array determined by groups of word lines WL2) by:
   a) raising WL2 to VCC; and
   b) setting the complementary bit line voltage (VBLB) to VCC (to write, or PRESET, a "0") or 0V (to write, or PRESET, a "1"). FIG. 6(A) shows a timing diagram for the WL2 and BLB pulses when writing a "0" to SRAM cell 230. The voltage at node D1 is now about 0V and the voltage at node D2 is now about the same as the value of $V_{ARRAY}$. At the end of a predetermined period of time t1 (e.g., 1–10 ns, preferably 2–5 ns, if $V_{ARRAY}$=VCC), the WL2 voltage may be brought down to 0, as shown in FIG. 6(A).

3. As shown in FIG. 6(B), raise Vcg to $Vcg_{RAM}$ (preferably a value of from [0.9×VCC] to [1.1×VCC], or about VCC), and approximately simultaneously, raise the true bit line voltage to VCC. A short time thereafter (e.g., a time sufficient to enable the data in NVM 220 to write itself into SRAM 230, which in certain embodiments may be from about 0.5 to 1000 ns (preferably from 1 to 200 ns, more preferably from 10 to 100 ns), raise WL1 to VCC, for a length of time $t_{pulse}$. For those NVM cells storing a "1, the FG11 Vt will be low, VCC (or slightly less than VCC) from BL is passed to D1, and the SRAM cell 230 switches to a "1 state. For NVM cells storing a "0, the FG11 Vt is high, and no voltage from BL will generally be passed into the SRAM cell 230, thereby maintaining a "0" in SRAM cell 230 (consistent with the example shown in FIGS. 6(A)–(B)). The time $t_{pulse}$ is generally selected to be that length of time that is sufficient to switch the SRAM cell 230 in a cell 200 having a $Vt_{low}$ NV transistor from a preset "0" to a "1 state, but insufficient to switch the SRAM cell 230 in a cell 200 having a $Vt_{high}$ NV transistor from a preset "0" to a state "1.

4. Increase $V_{ARRAY}$ to VCC.

In addition, during NV-RECALL, VCG may be lowered below VCC to make sure that the NV transistor leakage in the $Vt_{high}$ state is low enough that cells at a "0 state are not erroneously switched to a "1 state.

Since NV-RECALL does not generally affect the Vt of the NV transistors, NV-RECALL may be performed in a few ns (e.g., 1–10, preferably 2–5 ns) for a block of NVSRAM cells. In order to minimize current consumption (Icc) during NV-RECALL, the array may be subdivided into blocks, then a separate and/or independent NV-RECALL operations (PRESET and/or NV-READ) performed on each block. The blocks need not be equal in size because Icc may be higher when WL1 is at VCC (as compared to when WL2 is at VCC). Therefore, a block of WL2s may be selected for PRESET that is larger than the block of WL1s that are selected for the corresponding NV-READ.

During NV-RECALL, $V_{ARRAY}$ is generally<VCC to enable SRAM cells to switch to a "1 state when: (i) PRESET has written all 0's into the SRAM cells, (ii) BL is at or about VCC, and (iii) FG11 is conducting. In one embodiment of cell 200, pulldown transistors N11 and N12 may independently have a larger drive capability (e.g., W/L) than the corresponding pass transistors T12 and T11. In order to provide a larger current through T11 and FG11, $V_{ARRAY}$ is generally kept at<VCC ("$V_{A1}$", which in one embodiment, may range from (Vt+0.1(VCC−Vt)) to 0.9×VCC; in another embodiment, $V_{A1}$ may range from (VCC/4) to (3/4)VCC; in yet another embodiment [where VCC=5V], $V_{A1}$ may range from 0.8V to 4.0V, preferably 1.0V to 3.0V). The n-well enclosing the PMOS transistors P11 and P12 is generally biased at or about VCC to prevent forward biasing the $P^+$/n-well drain junctions of the transistors P11 and P12. This may mean that the P11 and P12 n-wells, on the one hand, and the $V_{ARRAY}$ bus(ses), on the other hand, may not share common contacts. At the end of a NV-RECALL operation, $V_{ARRAY}$ is generally ramped from $V_{A1}$ to VCC.

The following may summarize key aspects of the NV-RECALL operation, in particular for the cell 200 of FIG. 4 and the case where all SRAM cells 230 are PRESET to a digital logic "0":

1. Keep $V_{ARRAY}=V_{A1}$, where $V_{A1}$ is kept low (<VCC), but high enough for data retention.

2. Write "0 s to all cells in the array (PRESET to all 0's) by raising BLB and WL2 to $\geq V_{A1}$ (preferably near or about VCC).

3. Raise BL to VCC and Vcg to≈VCC. Apply VCC to WL1. Sequencing groups or blocks of word lines may keep the Icc low.

The cells 200 which stored a "1 during NV-STORE will have a conducting floating gate transistor FG11 (and transistor T11). In such cells, SRAM 230 may be switched to a "1 state, but where the voltage at D1 is generally about $V_{ARRAY}$.

4. Raise $V_{ARRAY}$ to VCC.

Figure 7:
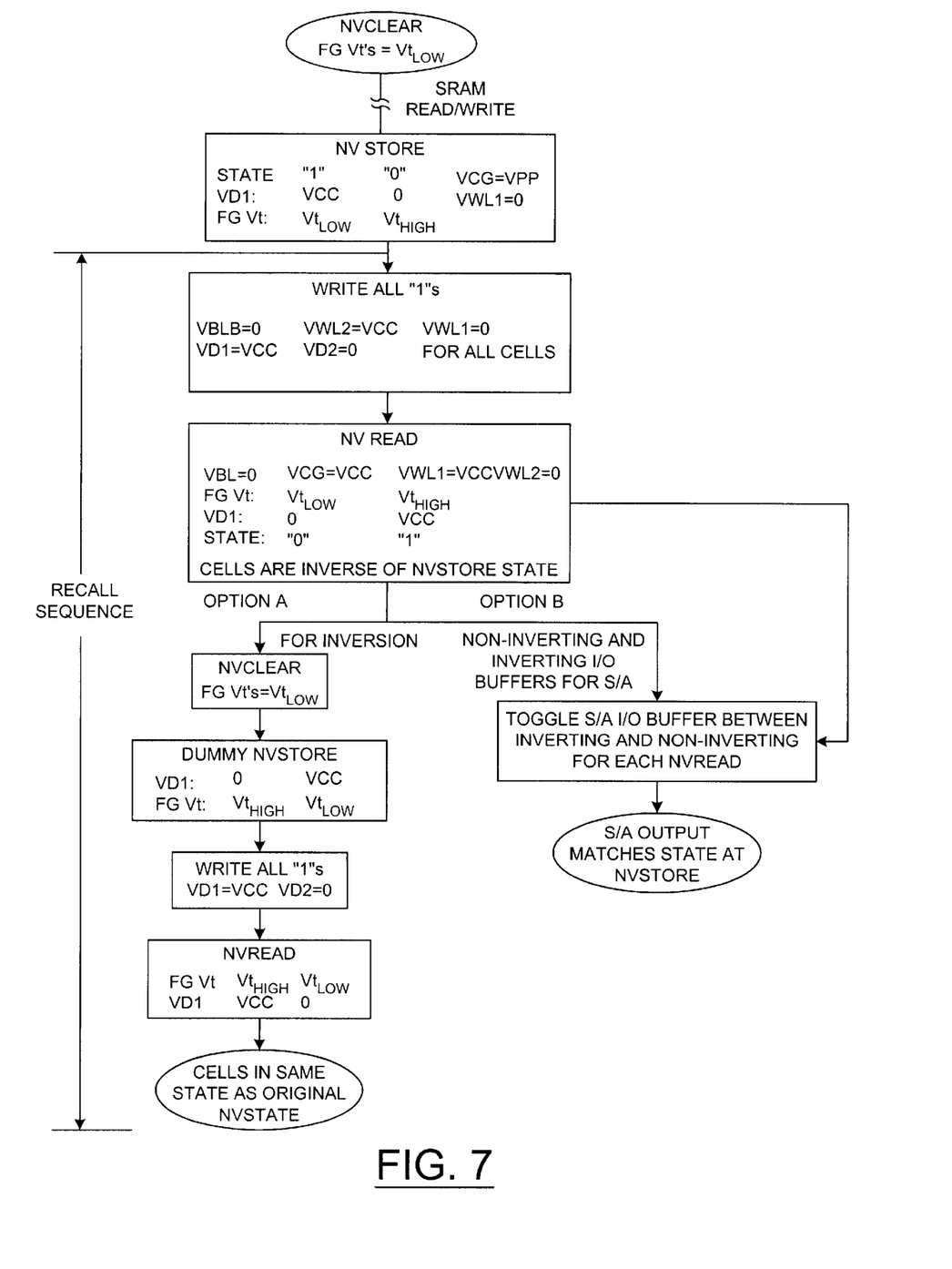
FIG. 7 is a flow chart exemplifying one set of NV-RECALL operations for the embodiment of FIG. 4.

As diagrammed in FIG. 7, an alternative NV-RECALL operation presets all SRAM cells 230 to a digital logic "1" prior to NV-READ. This alternative method may be preferred when pullup PMOS transistors P11 and/or P12 are weak (e.g., small current drive relative to gate transistor T11 and/or pulldown NMOS transistors N11 and/or N12). In such a case, it is generally easier to pull down D1 towards 0V through T11 and FG11.

In this embodiment, NV-CLEAR and NV-STORE may be as previously described, but $V_{ARRAY}$ may be about or equal to VCC during from particular columns, or blocks of columns, in the array. One output path includes an inverting output buffer (e.g., for data inversion after NV-READ), and the other includes a non-inverting buffer (e.g., for normal SRAM operations). Appropriate logic circuitry (e.g., a switch or mux) toggles between these paths, depending on the operation being performed.

An alternate embodiment of the 7T NVSRAM cell 200 is one in which the NMOS pass transistors T11 and T12 are replaced by PMOS transistors. Similarly, in the 7T NVS-RAM cell 200 shown in FIG. 4, the N-channel FG transistor FG11 may be replaced by a P-channel FG transistor, like that shown in FIG. 3. The operation of the alternative 7T NVSRAM cell with a P-channel FG transistor would be similar to the one with the N-channel FG transistor, but for

TABLE 4

| Mode | Vcg | WL1 | WL2 | BL | BLB | D1 | D2 | FG Vt | Comment(s) |
|---|---|---|---|---|---|---|---|---|---|
| NV-CLEAR | VNN (−7V to −12V pulse) | >VCC pulse | 0V | ≧VCC | 0V | data | datab | low | All FG Vt's set low by FN tunneling. |
| NV-STORE | Vpp pulse | 0V | 0V | X | X | data | datab | low or high | FG Vt = low if data = 1 |
| PRESET ALL 1's | 0V | 0V | VCC | VCC | 0V | VCC | 0V | low or high | D1 = VCC for all cells. FG Vt set by NV-STORE. |
| NV READ (for NV-RECALL) | VCC | VCC | 0V | 0V | VCC | datab | data | low or high | FG Vt set by NV-STORE. Cells are restored to state complementary to NV-STORE state. | both NV-RECALL steps, thereby avoiding any voltage translation circuitry used to decrease $V_{ARRAY}$ in the "all 0s" PRESET step. However, the recalled data in the "all is" method are inverted from their original state in SRAM 230 just prior to NV-STORE. This "all is" NV-RECALL operation is summarized in Table 4, where "X"=don't care.

Of course, the recalled inverted data must be re-inverted to get back to its original state. FIG. 7 shows two methods of re-inverting the recalled inverted data, one of which was described generally for NVSRAM cell 100, and one which now will be described for NVSRAM cell 200. However, any method of data inversion that works under the operational conditions of the integrated circuit containing the present NVSRAM array will be acceptable.

In a first option, the entire NV-CLEAR, NV-STORE and NV-RECALL sequence is repeated (a so-called "dummy STORE and RECALL"). As for the first such sequence, NV-CLEAR sets the FG11 Vt low. A "dummy" NV-STORE operation maintains a low FG11 Vt for those cells in which the inverted SRAM data is a digital "1", and changes the FG11 Vt to high if the inverted SRAM data is a digital "0." NV-RECALL then comprises PRESETting all SRAM cells to a digital "1", then NV-READing the cells to re-invert the data therein.

In a second option, the integrated circuit may have two output paths from the sense amplifiers receiving data signals appropriate changes in the BL voltages for the p-channel floating gate transistor operation (see, e.g., Table 2 above).

The band widths, or margins for error, when transferring data between NVM and SRAM elements in the present invention is remarkably large, compared to conventional "shadow" NVM that communicates with a corresponding SRAM through a bus. This relatively large margin becomes particularly important when transferring data upon a power loss or failure.

Figure 8:
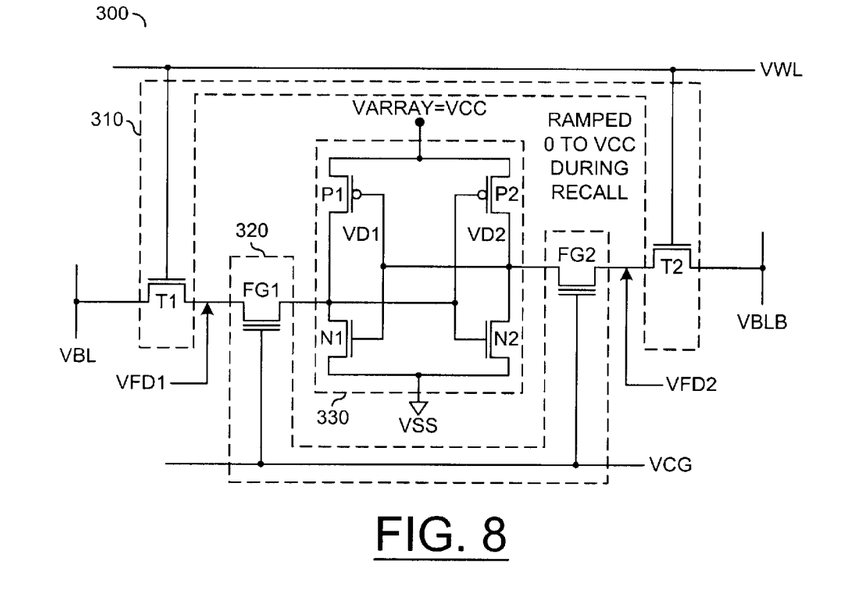
FIG. 8 is a schematic diagram of a third embodiment of the present invention.
Figure 9:
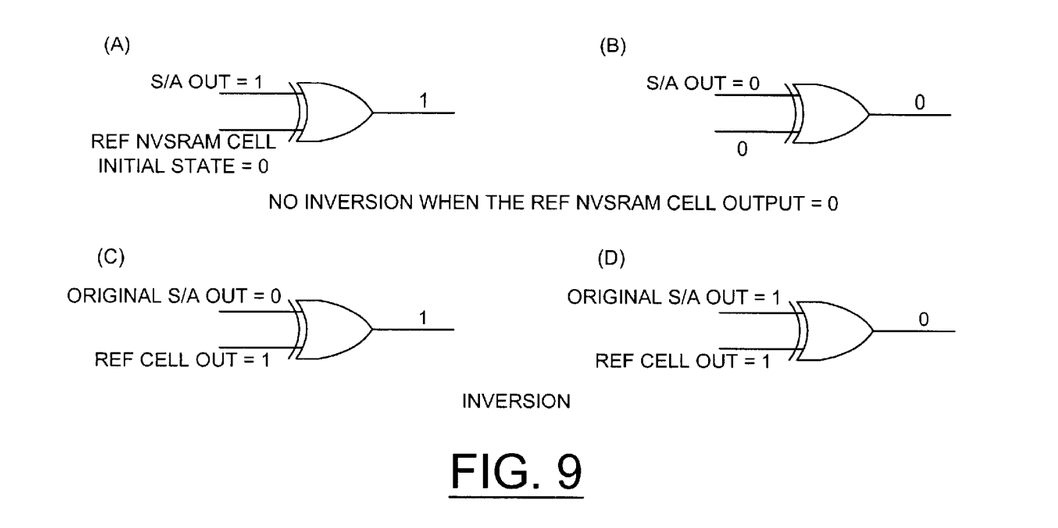
FIGS. 9(A)–9(D) are a series of exclusive OR gates (XORs) useful in one embodiment of a NV-RECALL operation in which initially recalled data may be inverted.

Referring now to FIG. 8, a third embodiment of the present NVSRAM cell is shown. NVSRAM cell 300 is similar to NVSRAM cell 200, except for an extra NV transistor between gate transistor T22 and the SRAM cell (latch) 330, and one less word line to control transistors in gate 310. One advantage of the cell 300 is the addition of only one global control signal VCG and two floating gate transistors FG1 and FG2 to a conventional 6T SRAM cell.

The NV-CLEAR, NV-STORE and NV-RECALL operations are quite similar to those of the other NVSRAM cells described herein, and may be summarized in TABLE 5 below.

TABLE 5

| Mode | Vcg | WL | BL | BLB | D1 | D2 | Vt1 (of FG1) | Vt2 (of FG2) | Comment(s) |
|---|---|---|---|---|---|---|---|---|---|
| NV-CLEAR | VNN (e.g., −7V to −12V) | VCC+Vt (pulse) | VCC | VCC | data | datab | Low | Low | VNN comprises pulse of −10 ms. FG Vt pulled low (−0V or less) by FN tunneling from negative FG to positively biased drain. Follows power up and every NV-RECALL. |

TABLE 5-continued

| Mode | Vcg | WL | BL | BLB | D1 | D2 | Vt1 (of FG1) | Vt2 (of FG2) | Comment(s) |
|---|---|---|---|---|---|---|---|---|---|
| SRAM WRITE/READ | VCC | VCC | data | datab | data | datab | Low | Low | Normal SRAM operation |
| NV-STORE ("1") | VPP (e.g., 12–18V) | 0V | X | X | VCC | 0V | Low | High | VPP comprises pulse of –1 ms. High FG Vt (–VCC) by FN tunneling of electrons to FG. No FN tunneling when channel is at VCC. |
| NV-STORE ("0") |  | 0V | X | X | 0V | VCC | High | Low |  |
| NV-RECALL ("1") | VCC | VCC | VCC | VCC | VCC | 0V | Low | High | Generally followed by NV-CLEAR. |
| NV-RECALL ("0") | VCC | VCC | VCC | VCC | 0V | VCC | High | Low | Generally followed by NV-CLEAR. |

One advantage of the NVSRAM cell 300 is the addition of only one global control signal VCG and two floating gate transistors FG1 and FG2. Several differences in the operation of NVSRAM cell 300 should be noted.

For example, to clear the NV transistors, both I/O lines (BL and BLB) are raised to VCC. When Vcg is at VNN, both NV transistors are non-conducting, and any data in SRAM 330 will not be disturbed. At the end of the NV-CLEAR operation, it may be advantageous to first turn off the gate transistors (e.g., bring WL to 0V for the circuit in FIG. 8) before removing VNN from Vcg.

After NV-STORE and during NV-RECALL, one NV transistor will have a high Vt, while the other will have a low Vt. This may help improve the stability of the data transferred back into SRAM 330 from NVM 320, relative to 7T NVSRAM cell 200.

The general objective of the NV-RECALL operation is to restore the state of the SRAM array (e.g., the latched data) that was saved during the NV-STORE operation. The operation may have the following sequence:

a. With the initial state of the word line (WL)=0V, raise both the BL and BLB voltages to VCC.

b. Raise the WL and Vcg voltages to VCC. If the saved state corresponds to a "1" (e.g., the voltage at node D1 is about VCC and the voltage at node D2 is about 0V), the Vt of FG1 (e.g., Vt1) is low, and VCC on BL is passed to D1. The Vt of FG2 (e.g., Vt2) is high, and VCC from BLB is not passed to D2.

c. Ramp $V_{ARRAY}$ to VCC. (Vss=0 for all operations.)

The SRAM latch now has a "1" state, and the SRAM data has been restored. The recall operation is generally performed after power up following a power fail or to restore the saved SRAM state.

As for the other embodiments, NVSRAM cell 300 may include p-channel gate transistors, in which case the array oerations are as shown in Table 6 below.

TABLE 6

| Mode | Vcg | WL | BL | BLB | D1 | D2 | Vt1 (of FG1) | Vt2 (of FG2) | Comment(s) |
|---|---|---|---|---|---|---|---|---|---|
| NV-CLEAR | VNN (e.g., –7V to –11V) | 0V | VCC | VCC | data | datab | Low | Low | VNN comprises pulse of –0.1–10 ms. FG Vt pulled low (–0V or less). Follows power up and every NV-RECALL. |
| SRAM WRITE/READ | VCC | 0V | data | datab | data | datab | Low | Low | Normal SRAM operation |
| NV-STORE ("1") | VPP (e.g., 12–18V) | VCC | VCC | VCC | VCC | 0V | Low | High | Unbalanced FG Vt's. |
| NV-STORE ("0") |  | VCC | VCC | VCC | 0V | VCC | High | Low |  |
| NV-RECALL ("1") | VCC | 0V | VCC | VCC | VCC | 0V | Low | High | Generally followed by NV-CLEAR. |
| NV-RECALL ("0") | VCC | VCC | VCC | VCC | 0V | VCC | High | Low | Generally followed by NV-CLEAR. |

While the invention has been particularly shown and described with reference to the preferred embodiments thereof, it will be understood by those skilled in the art that various changes in form and details may be made without departing from the spirit and scope of the invention.

What is claimed is:

1. A non-volatile SRAM cell, comprising:
   a nonvolatile memory element;
   a volatile memory element coupled to said nonvolatile memory element;
   a gate circuit coupled to said nonvolatile memory element, wherein said gate circuit (i) is configured to transfer data to and from a first input/output line into said volatile memory element and (ii) comprises (a) a first transistor coupled between said first input/output line and said non-volatile memory element and (b) a second transistor coupled between said first input/output line and said volatile memory element.

2. The non-volatile SRAM cell according to claim 1, further comprising a second input/output line coupled to said volatile memory element.

3. The non-volatile SRAM cell according to claim 1, wherein said volatile memory element is coupled to said nonvolatile memory element, and said non-volatile SRAM cell is configured to store data from said volatile memory element in said nonvolatile memory element upon a power fail event.

4. The non-volatile SRAM cell according to claim 1, further comprising a word line coupled to said gate circuit.

5. The non-volatile SRAM cell according to claim 1, wherein said first transistor comprises a first pass transistor, and said second transistor comprises a second pass transistor coupled to a second input/output line, said second input/output line complementary to said first input/output line.

6. The non-volatile SRAM cell according to claim 1, wherein said nonvolatile memory element comprises a floating gate transistor.

7. The non-volatile SRAM cell according to claim 1, wherein said nonvolatile memory element comprises an electrically erasable and programmable nonvolatile transistor.

8. The non-volatile SRAM cell according to claim 1, wherein said volatile memory element comprises a latch.

9. The non-volatile SRAM cell according to claim 8, wherein said first transistor comprises a first pass transistor, and said second transistor comprises a second pass transistor coupled to a second input/output line, said second input/output line complementary to said first input/output line.

10. The non-volatile SRAM cell according to claim 9, wherein said latch is coupled to said nonvolatile memory element and said gate circuit.

11. The non-volatile SRAM cell according to claim 1, wherein said non-volatile SRAM cell forms a cell of a non-volatile SRAM array.

12. The non-volatile SRAM cell according to claim 11, wherein said non-volatile SRAM array comprises a plurality of blocks of the non-volatile SRAM cells, each of said blocks independently comprising N by m cells, wherein n and m are each independently an integer of at least 2.

13. A circuit comprising:
    volatile means for storing data;
    non-volatile means for storing said data upon a power fail event, coupled to said volatile data storing means; and
    means for recalling said data from said non-volatile data storing means into said volatile data storing means when power is reapplied to a device containing the circuit, wherein said recalling means comprises (a) a first transistor coupled between a first input/output line and said non-volatile means and (b) a second transistor coupled between said first input/output line and said volatile means.

14. A method for recalling data previously stored in a volatile memory, comprising the sequential steps of:
    storing said data in a non-volatile memory element coupled to said volatile memory upon a power fail event; and
    recalling said data from said non-volatile memory element into said volatile memory in response to an application of power to a device containing both the non-volatile memory element and the volatile memory, wherein said non-volatile memory comprises (a) a first transistor coupled between a first input/output line and said non-volatile memory element and (b) a second transistor coupled between said first input/output line and said volatile memory.

15. The method according to claim 14, wherein said recalling step comprises the steps of:
    writing a predetermined digital logic value into said volatile memory, and
    reading said non-volatile memory element.

16. A circuit comprising:
    a memory storage element;
    a true bitline and a complement bitline configured to write data to and read data from said memory storage element; and
    a floating gate device (i) coupled between said true bitline and said memory storage element and (ii) configured to store data from said memory storage element during a power down condition.

17. The circuit according to claim 16, further comprising:
    a second floating gate device (i) coupled between said complement bitline and said memory storage element and (ii) configured to store data from said memory storage element during said power down condition.

* * * * *